US010693476B2

(12) United States Patent
Maruyama et al.

(10) Patent No.: US 10,693,476 B2
(45) Date of Patent: Jun. 23, 2020

(54) SEMICONDUCTOR DEVICE AND CONTROL METHOD OF THE SAME

(71) Applicant: Renesas Electronics Corporation, Tokyo (JP)

(72) Inventors: Yuichi Maruyama, Tokyo (JP); Noriaki Matsuno, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 105 days.

(21) Appl. No.: 15/950,968

(22) Filed: Apr. 11, 2018

(65) Prior Publication Data

US 2018/0358973 A1 Dec. 13, 2018

(30) Foreign Application Priority Data

Jun. 12, 2017 (JP) ................................ 2017-114988

(51) Int. Cl.
| | | |
|---|---|---|
| H03L 7/099 | (2006.01) | |
| H03K 3/53 | (2006.01) | |
| H03L 1/02 | (2006.01) | |
| H03B 5/04 | (2006.01) | |
| H03B 5/36 | (2006.01) | |

(52) U.S. Cl.
CPC .............. *H03L 7/099* (2013.01); *H03B 5/04* (2013.01); *H03B 5/366* (2013.01); *H03K 3/53* (2013.01); *H03L 1/026* (2013.01); *H03L 1/027* (2013.01); *H03L 1/028* (2013.01); *H03B 2200/005* (2013.01); *H03B 2200/0068* (2013.01); *H03B 2201/0266* (2013.01)

(58) Field of Classification Search
CPC ......... H03L 7/099; H03L 1/026–1/028; H03K 3/53; H03B 2201/0266; H03B 2200/005; H03B 2200/0068; H03B 5/04; H03B 5/366; H03B 5/32
See application file for complete search history.

(56) References Cited

U.S. PATENT DOCUMENTS

| | | | |
|---|---|---|---|
| 7,741,924 B2 | 6/2010 | Matsui et al. | |
| 2017/0063305 A1* | 3/2017 | Shirotori | ................ H03B 5/32 |
| 2017/0194971 A1* | 7/2017 | Yonezawa | ............... H03L 7/095 |
| 2017/0279453 A1* | 9/2017 | Sato | ........................ H03B 5/32 |

FOREIGN PATENT DOCUMENTS

| | | |
|---|---|---|
| JP | 2008-300978 A | 12/2008 |
| JP | 2013-098860 A | 5/2013 |

\* cited by examiner

*Primary Examiner* — Jeffrey M Shin
(74) *Attorney, Agent, or Firm* — McDermott Will & Emery LLP

(57) ABSTRACT

Increases of circuit scale and power consumption are suppressed while frequency deviation is kept within a predetermined allowable range. A semiconductor device according to an embodiment includes a variable load capacity circuit including a plurality of load capacity elements coupled in parallel to one end of a crystal resonator and a plurality of switches that are respectively serially coupled to the load capacity elements, and a switch control unit that controls ON/OFF of the switches on the basis of information to be an index of frequency deviation due to temperature change of a frequency signal obtained by oscillating the crystal resonator. The switch control unit changes the number of switches that will be turned ON among the plurality of switches so that an absolute value of the frequency deviation becomes small when the information is not included in a predetermined allowable range.

15 Claims, 8 Drawing Sheets

| TYPE OF CRYSTAL | TEMPERATURE RANGE | THE NUMBER OF PAIRS OF SWITCHES TO BE ON |
|---|---|---|
| A | -40°C TO 85°C (ALLOWABLE TEMPERATURE RANGE) | 10 |
| A | 85°C TO 95°C | 11 |
| A | 95°C TO 100°C | 12 |
| A | 100°C TO 105°C | 13 |
| B | -40°C TO 85°C (ALLOWABLE TEMPERATURE RANGE) | 10 |
| B | 85°C TO 100°C | 11 |
| B | 100°C TO 105°C | 12 |

| TYPE OF CRYSTAL RESONATOR | AMOUNT OF FREQUENCY LOWERING WHEN ADDING ONE PAIR OF SWITCHES TO BE ON |
|---|---|
| A | 8 kHz |
| B | 13 kHz |
| C | 10 kHz |

US 10,693,476 B2

SEMICONDUCTOR DEVICE AND CONTROL METHOD OF THE SAME

CROSS-REFERENCE TO RELATED APPLICATIONS

The disclosure of Japanese Patent Application No. 2017-114988 filed on Jun. 12, 2017 including the specification, drawings and abstract is incorporated herein by reference in its entirety.

BACKGROUND

The present invention relates to a semiconductor device and a control method of the same.

A crystal oscillator is widely used to generate a reference frequency signal in, for example, a semiconductor device for wireless communication. The crystal oscillator includes a crystal resonator and an oscillation circuit that oscillates the crystal resonator.

An oscillation frequency of the crystal resonator has a slight temperature dependence, and an oscillation frequency of a normal AT-cut crystal resonator varies in a cubic curve with respect to temperature. As an example, in a temperature range of −40 to 85° C., the oscillation frequency has a frequency deviation of about ±20 to 30 ppm.

Japanese Unexamined Patent Application Publication Nos. 2008-300978 and 2013-098860 disclose a temperature compensated crystal oscillator (TCXO) including a temperature compensation circuit that performs control so as to cancel the temperature dependence in a cubic curve described above and maintain the oscillation frequency constant. The temperature compensated crystal oscillator can reduce the frequency deviation to, for example, ±1 ppm or less.

SUMMARY

In the temperature compensated crystal oscillator as disclosed in Japanese Unexamined Patent Application Publication Nos. 2008-300978 and 2013-098860, as described above, the temperature dependence in a cubic curve is cancelled and the frequency deviation is reduced to, for example, ±1 ppm or less. Therefore, it is necessary to store a huge amount of data and continuously change load capacity by using an analog variable capacitance element such as a varicap. Therefore, there is a problem that circuit scale and power consumption increase.

Other objects and novel features will become apparent from the description of the present specification and the accompanying drawings.

A semiconductor device according to an embodiment includes a variable load capacity circuit including a plurality of load capacity elements coupled in parallel to one end of a crystal resonator and a plurality of switches that are respectively serially coupled to the load capacity elements, and a switch control unit that controls ON/OFF of the switches on the basis of information to be an index of frequency deviation due to temperature change of a frequency signal obtained by oscillating the crystal resonator. The switch control unit changes the number of switches that will be turned ON among the plurality of switches so that an absolute value of the frequency deviation becomes small when the information is not included in a predetermined allowable range.

According to the embodiment, it is possible to suppress increases of circuit scale and power consumption while keeping the frequency deviation within a predetermined allowable range.

DETAILED DESCRIPTION

Figure 1:
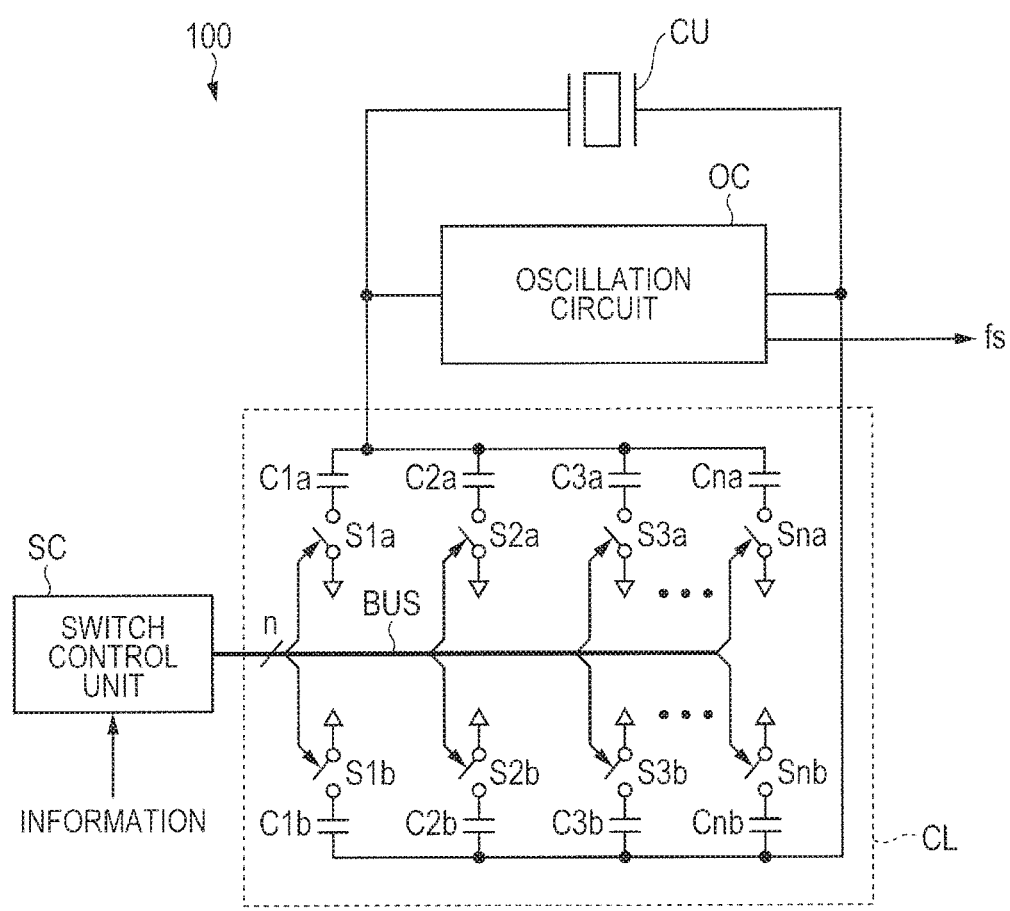
FIG. 1 is a block diagram showing a configuration of a semiconductor device 100 according to a first embodiment.

For clarity of explanation, the following description and drawings are appropriately omitted and simplified. The components shown in the drawings as functional blocks that perform various processing can be formed by a CPU, a memory, and other circuits as hardware and are realized by a program and the like loaded in a memory as software. Therefore, it should be understood by those skilled in the art that the functional blocks can be realized in various forms by only hardware, only software, or a combination of these, and the functional blocks are not limited to any one of hardware, software, and a combination of these. In the drawings, the same components are denoted by the same reference symbols and redundant description is omitted as appropriate.

First Embodiment

<Configuration of Semiconductor Device 100>

First, a semiconductor device according to a first embodiment will be described with reference to FIG. 1. FIG. 1 is a block diagram showing a configuration of a semiconductor device 100 according to the first embodiment. As shown in FIG. 1, the semiconductor device 100 according to the first embodiment includes a crystal resonator CU, an oscillation circuit OC, a variable load capacity circuit CL, and a switch control unit SC. Here, the variable load capacity circuit CL includes 2n (n is a natural number greater than or equal to 2) load capacity elements C1a to Cna and C1b to Cnb and 2n switches S1a to Sna and S1b to Snb.

As shown in FIG. 1, in the semiconductor device 100, the crystal resonator CU is oscillated by the oscillation circuit OC and a frequency signal fs is outputted from the oscillation circuit OC. One end of the crystal resonator CU is coupled with one ends of all the load capacity elements C1a to Cna included in the variable load capacity circuit CL. The other ends of the load capacity elements C1a to Cna are respectively coupled with one ends of the switches S1a to Sna included in the variable load capacity circuit CL. The other ends of all the switches S1a to Sna are coupled to ground.

That is, the load capacity elements C1a to Cna are respectively and serially coupled with the switches S1a to Sna between one end of the crystal resonator CU and the ground. In other words, the serially coupled n pairs of the load capacity elements C1a to Cna and the switches S1a to Sna are coupled in parallel between one end of the crystal resonator CU and the ground. The switches S1a to Sna are, for example, MOS (Metal-Oxide-Semiconductor) transistors.

The switches S1a to Sna may be coupled to one end of the crystal resonator CU, and the load capacity elements C1a to Cna may be coupled to the ground. The capacities of each of the load capacity elements C1a to Cna need not be equal. However, when the capacities are equal, it is easy to control and manufacture the load capacity element C1a to Cna.

Similarly, the other end of the crystal resonator CU is coupled with one ends of all the load capacity elements C1b to Cnb included in the variable load capacity circuit CL. The other ends of the load capacity elements C1b to Cnb are respectively coupled with one ends of the switches S1b to Snb included in the variable load capacity circuit CL. The other ends of all the switches S1b to Snb are coupled to the ground.

That is, the load capacity elements C1b to Cnb are respectively and serially coupled with the switches S1b to Snb between one end of the crystal resonator CU and the ground. In other words, the serially coupled n pairs of the load capacity elements C1b to Cnb and the switches S1b to Snb are coupled in parallel between one end of the crystal resonator CU and the ground. The switches S1b to Snb are, for example, MOS transistors.

The switches S1b to Snb may be coupled to the other end of the crystal resonator CU, and the load capacity elements C1b to Cnb may be coupled to the ground. The capacities of each of the load capacity elements C1b to Cnb need not be equal. However, when the capacities are equal, it is easy to control and manufacture the load capacity element C1b to Cnb.

The switch control unit SC acquires information to be an index of frequency deviation of the frequency signal fs due to temperature change. The switch control unit SC controls ON/OFF of n pairs of the switches S1a to Sna and S1b to Snb through a bus BUS including n signal lines on the basis of the acquired information. Here, ON/OFF of the switches S1a and Sib, which are a pair, is controlled by the same signal. Similarly, ON/OFF of the switches S2a and S2b to switches Sna and Snb, which are pairs, is controlled by the same signal, respectively.

When the acquired information is not included in a predetermined allowable range, the switch control unit SC changes the number of switches that will be turned ON among the switches S1a to Sna and S1b to Snb so that an absolute value of the frequency deviation of the frequency signal fs outputted from the oscillation circuit OC becomes small. Thereby, the number of the load capacity elements C1a to Cna that are coupled between one end of the crystal resonator CU and the ground is changed, and the load capacity coupled to the one end of the crystal resonator CU is changed. Similarly, the number of the load capacity elements C1b to Cnb that are coupled between the other end of the crystal resonator CU and the ground is changed, and the load capacity coupled to the other end of the crystal resonator CU is changed.

In the semiconductor device 100 according to the present embodiment, both the load capacities coupled to both ends of the crystal resonator CU can be changed. However, it is all right that the load capacity coupled to at least one end of the crystal resonator CU can be changed.

<Description of Effects>

As described above, the semiconductor device 100 according to the present embodiment includes the switch control unit SC that controls ON/OFF of the switches S1a to Sna and S1b to Snb on the basis of the information to be an index of frequency deviation of the frequency signal fs due to temperature change. Specifically, when the acquired information is not included in the predetermined allowable range, the switch control unit SC changes the number of switches that will be turned ON among the switches S1a to Sna and S1b to Snb so that the absolute value of the frequency deviation of the frequency signal fs becomes small. Therefore, it is possible to change the load capacities coupled to both ends of the crystal resonator CU and keep the frequency deviation of the frequency signal fs outputted from the oscillation circuit OC within a predetermined allowable range.

On the other hand, in the semiconductor device 100 according to the present embodiment, it is not necessary to store a huge amount of data in order to cancel a cubic curve shaped temperature dependence as in a temperature compensated crystal oscillator (TCXO). Further, it is not necessary to continuously change the load capacity, so that an analog variable capacitance element such as a varicap is not required. Therefore, in the semiconductor device 100 according to the present embodiment, it is possible to suppress increases of circuit scale and power consumption as compared with in the temperature compensated crystal oscillator.

As described above, in the semiconductor device 100 according to the present embodiment, it is possible to suppress increases of circuit scale and power consumption while keeping the frequency deviation within a predetermined allowable range.

<Detailed Configuration of Semiconductor Device 100>

Figure 2:
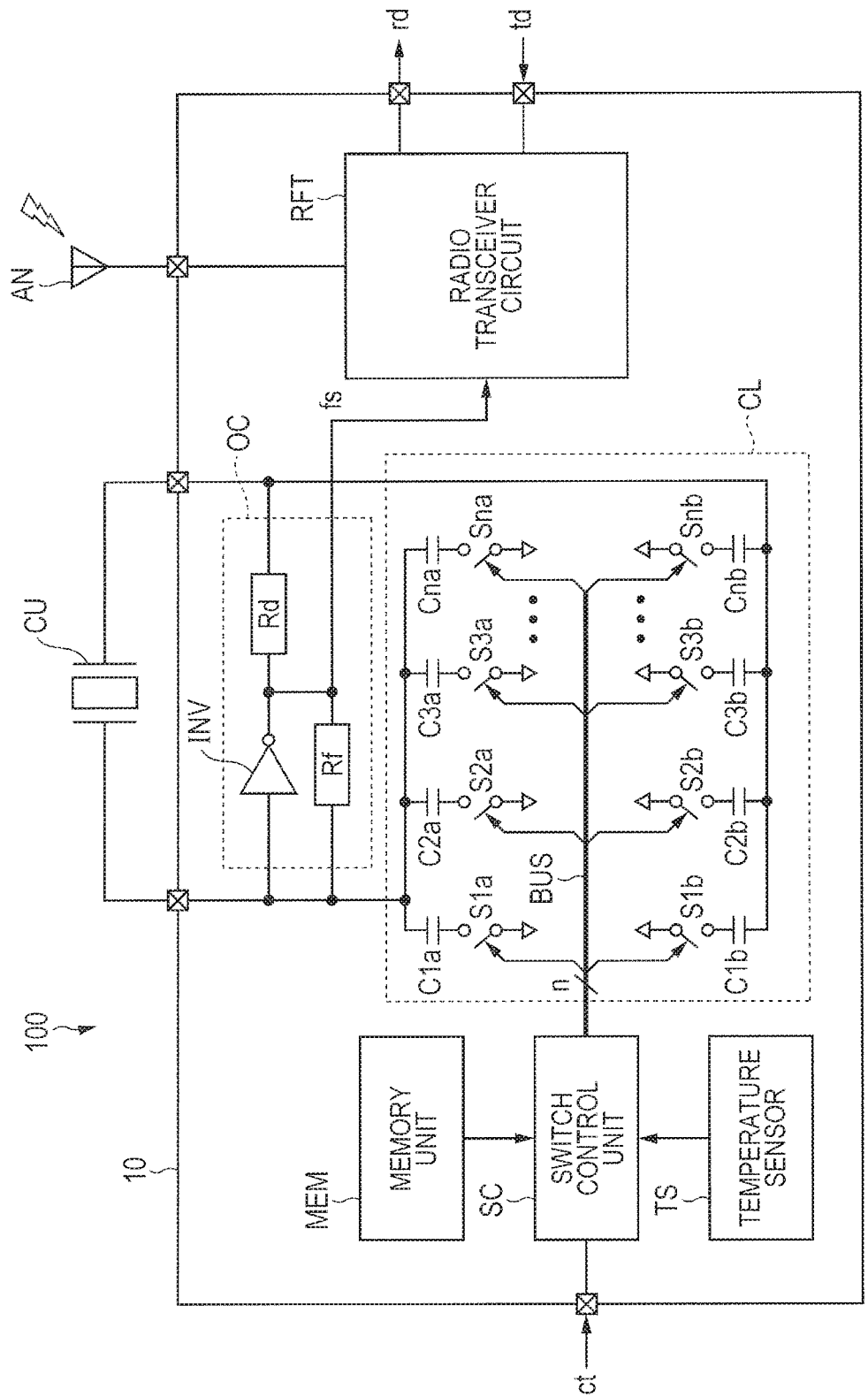
FIG. 2 is a detailed block diagram showing the configuration of the semiconductor device 100 according to the first embodiment.

Next, the semiconductor device according to the first embodiment will be described in more detail with reference to FIG. 2. FIG. 2 is a detailed block diagram showing the configuration of the semiconductor device 100 according to the first embodiment. As shown in FIG. 2, the semiconductor device 100 according to the first embodiment includes a temperature sensor TS, a memory unit MEM, a radio transceiver circuit RFT, and an antenna AN in addition to the crystal resonator CU, the oscillation circuit OC, the variable load capacity circuit CL, and the switch control unit SC shown in FIG. 1.

As shown in FIG. 2, the oscillation circuit OC, the variable load capacity circuit CL, the switch control unit SC, the memory unit MEM, the temperature sensor TS, and the radio transceiver circuit RFT are integrated in a radio transceiver LSI 10 composed of a semiconductor chip. The crystal resonator CU and the antenna AN are externally attached to terminals provided to the radio transceiver LSI 10.

As shown in FIG. 2, the oscillation circuit OC includes an invertor INV, a limiting resistor Rd, and a feedback resistor Rf. The oscillation circuit OC oscillates the crystal resonator CU and outputs the frequency signal fs.

The input of the invertor INV is coupled to one end of the crystal resonator CU, and the frequency signal fs is outputted from the output of the inverter INV.

The limiting resistor Rd is provided between the output of the invertor INV and the other end of the crystal resonator CU. The limiting resistor Rd prevents an excessive current from flowing into the oscillation circuit OC.

The feedback resistor Rf is provided in parallel with the invertor INV. Specifically, one end of the feedback resistor Rf is coupled to the input of the invertor INV and the other end of the feedback resistor Rf is coupled to the output of the invertor INV. The feedback resistor Rf feeds back a current from the output of the invertor INV to the input of the invertor INV and causes oscillation to continue.

One end of the crystal resonator CU is coupled with one ends of all the load capacity elements C1a to Cna included in the variable load capacity circuit CL. The other ends of the load capacity elements C1a to Cna are respectively coupled with one ends of the switches S1a to Sna included in the variable load capacity circuit CL. The other ends of all the switches S1a to Sna are coupled to the ground.

That is, the load capacity elements C1a to Cna are respectively and serially coupled with the switches S1a to Sna between one end of the crystal resonator CU and the ground. In other words, the serially coupled n pairs of the load capacity elements C1a to Cna and the switches S1a to Sna are coupled in parallel between one end of the crystal resonator CU and the ground. The switches S1a to Sna are, for example, MOS (Metal-Oxide-Semiconductor) transistors.

Similarly, the other end of the crystal resonator CU is coupled with one ends of all the load capacity elements C1b to Cnb included in the variable load capacity circuit CL. The other ends of the load capacity elements C1b to Cnb are respectively coupled with one ends of the switches S1b to Snb included in the variable load capacity circuit CL. The other ends of all the switches S1b to Snb are coupled to the ground.

That is, the load capacity elements C1b to Cnb are respectively and serially coupled with the switches S1b to Snb between one end of the crystal resonator CU and the ground. In other words, the serially coupled n pairs of the load capacity elements C1b to Cnb and the switches S1b to Snb are coupled in parallel between one end of the crystal resonator CU and the ground. The switches S1b to Snb are, for example, MOS transistors.

The switch control unit SC acquires temperature information from the temperature sensor TS. The switch control unit SC controls ON/OFF of the n pairs of switches S1a to Sna and S1b to Snb through the bus BUS including n signal lines on the basis of the acquired temperature information. Here, ON/OFF of the switches S1a and Sib, which are a pair, is controlled by the same signal. Similarly, ON/OFF of the switches S1a and S1b to the switches Sna and Snb, which are pairs, is controlled by the same signal, respectively.

Further, when the switch control unit SC acquires temperature information from the temperature sensor TS, the switch control unit SC refers to a table stored in the memory unit MEM and controls ON/OFF of the switches S1a to Sna and S1b to Snb. Therefore, it is possible to quickly process ON/OFF control of the switches S1a to Sna and S1b to Snb.

As described later in detail with reference to FIG. 3, the table shows a correspondence relationship between a temperature range and the number of pairs of switches to be ON in the temperature range for each type (crystal type) of the crystal resonator CU. This is because when the crystal type is different, the frequency characteristic is somewhat different. Therefore, the switch control unit SC acquires a crystal type signal ct that indicates a type of the crystal resonator CU to be used.

When the acquired temperature information is not included in a predetermined allowable range, the switch control unit SC changes the number of switches that will be turned ON among the switches S1a to Sna and S1b to Snb so that the absolute value of the frequency deviation of the frequency signal fs outputted from the oscillation circuit OC becomes small. Thereby, the number of the load capacity elements C1a to Cna that are coupled between one end of the crystal resonator CU and the ground is changed, and the load capacity coupled to the one end of the crystal resonator CU is changed. Similarly, the number of the load capacity elements C1b to Cnb that are coupled between the other end of the crystal resonator CU and the ground is changed, and the load capacity coupled to the other end of the crystal resonator CU is changed.

The temperature sensor TS indirectly detects a temperature of the crystal resonator CU. A bandgap reference circuit that generates a reference voltage for an analog circuit that includes the radio transceiver circuit RFT may be used as the temperature sensor TS. In this case, it is not necessary to separately provide the temperature sensor TS, so that it is possible to suppress increase in the circuit scale.

The memory unit MEM stores a table that is referred to by the switch control unit SC. Here, FIG. 3 is a diagram showing an example of the table stored in the memory unit MEM in the semiconductor device 100 according to the first embodiment. As shown in FIG. 3, the table shows the type (crystal type) of the crystal resonator CU, the temperature range, and the number of pairs of switches to be ON. Specifically, the table shows a correspondence relationship between the temperature range and the number of pairs of switches to be ON for each of the different crystal types A and B. When the crystal type is different, the frequency characteristics such as the temperature dependence shown in FIG. 5 described later and the load capacity dependence shown in FIG. 6 described later are different at least to a certain extent. Therefore, the table shows a correspondence relationship between the temperature range and the number of pairs of switches to be ON for each crystal type.

Figures 3, 4:
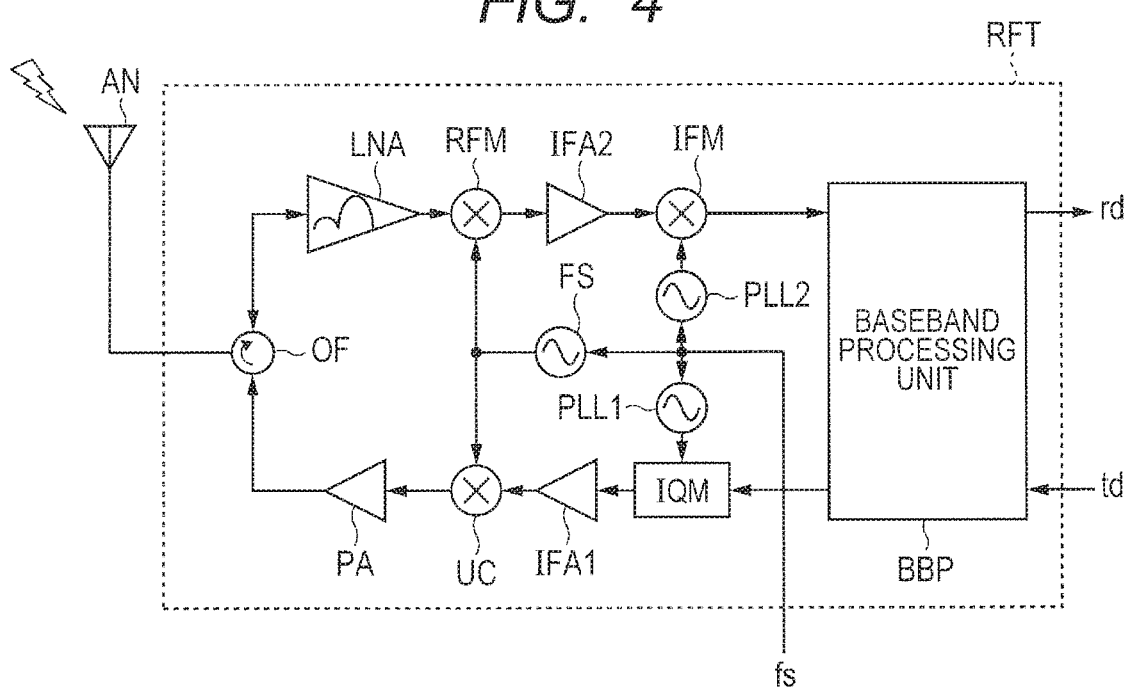
FIG. 3 is a diagram showing an example of a table stored in a memory unit MEM in the semiconductor device 100 according to the first embodiment.
FIG. 4 is a block diagram showing an example of a configuration of a radio transceiver circuit RFT included in the semiconductor device 100 according to the first embodiment.

As shown in FIG. 3, in both of the crystal types A and B, 10 pairs of switches are turned ON in an allowable temperature range of the crystal resonator CU (−40 to 85° C. in the example of FIG. 3). In both of the crystal types A and B, as the temperature rises exceeding the allowable temperature range, the number of pairs of switches to be ON is increased.

In the example of FIG. 3, specifically, in the case of the crystal type A, 11 pairs of switches are turned ON in a temperature range of 85 to 95° C., 12 pairs of switches are turned ON in a temperature range of 95 to 100° C., and 13 pairs of switches are turned ON in a temperature range of 100 to 105° C. On the other hand, in the case of the crystal type B, 11 pairs of switches are turned ON in a temperature range of 85 to 100° C. and 12 pairs of switches are turned ON in a temperature range of 100 to 105° C. As a matter of course, the temperature ranges and the numbers of pairs of switches to be ON shown in FIG. 3 are only an example and can be appropriately changed.

The radio transceiver circuit RFT generates a transmission RF (Radio Frequency) signal from transmission data td received from outside by using the frequency signal fs outputted from the oscillation circuit OC and wirelessly transmits the transmission RF signal through the antenna AN. On the other hand, the radio transceiver circuit RFT wirelessly receives a reception RF (Radio Frequency) signal through the antenna AN, generates a reception data rd from the reception RF signal, and transmits the reception data rd to the outside.

FIG. 4 is a block diagram showing an example of a configuration of the radio transceiver circuit RFT included in the semiconductor device 100 according to the first embodiment. The superheterodyne type radio transceiver circuit RFT includes a baseband processing unit BBP, an IQ modulator IQM, IF (Intermediate Frequency) amplifiers IFA1 and IFA2, PLL (Phase Locked Loop) circuits PLL1 and PLL2, a frequency synthesizer FS, an up-converter UC, a power amplifier PA, an output filter OF, a low-noise amplifier LNA, an RF (Radio Frequency) mixer RFM, an IF (Intermediate Frequency) mixer IFM. Various filters are omitted.

The baseband processing unit BBP encodes the transmission data td received from outside into a transmission IQ signal and transmits the transmission IQ signal to the IQ modulator IQM. On the other hand, the baseband processing unit BBP decodes a reception IQ signal received from the IF mixer IFM into reception data rd and transmits the reception data rd to the outside.

Hereinafter, a flow of the transmission data td will be described.

In the IQ modulator IQM, an IF (Intermediate Frequency) signal outputted from the PLL circuit PLL1 is orthogonally modulated by the transmission IQ signal outputted from the baseband processing unit BBP and a transmission IF signal is generated. Here, the IF signal outputted from the PLL circuit PLL1 is generated from the frequency signal fs outputted from the oscillation circuit OC.

The transmission IF signal outputted from the IQ modulator IQM is amplified by the IF amplifier IFA1. The amplified transmission IF signal is mixed with a frequency signal outputted from the frequency synthesizer FS and up-converted to a transmission RF signal in the up-converter UC. Here, the frequency signal outputted from the frequency synthesizer FS is generated from the frequency signal fs outputted from the oscillation circuit OC.

The transmission RF signal outputted from the up-converter UC is amplified by the power amplifier PA and thereafter wirelessly transmitted from the antenna AN through the output filter OF. Here, the output filter OF suppresses propagation of the transmission RF signal, which is wirelessly transmitted from the antenna AN, to the low-noise amplifier LNA.

Next, a flow of the reception data rd will be described.

The reception RF signal wirelessly received by the antenna AN is inputted into the low-noise amplifier LNA through the output filter OF and amplified by the low-noise amplifier LNA. Here, the output filter OF suppresses propagation of the reception RF signal, which is wirelessly received by the antenna AN, to the power amplifier PA.

The amplified reception RF signal is mixed with the aforementioned frequency signal outputted from the frequency synthesizer FS and down-converted to a reception IF signal in the RF mixer RFM. The reception IF signal outputted from the RF mixer RFM is amplified by the IF amplifier IFA2.

The amplified reception IF signal is mixed with an IF signal outputted from the PLL circuit PLL2 in the IF mixer IFM and demodulated into a reception IQ signal. Then, the reception IQ signal outputted from the IF mixer IFM is decoded into the reception data rd by the baseband processing unit BBP.

<Description of Effects>

As described above, the semiconductor device 100 according to the present embodiment includes the switch control unit SC that controls ON/OFF of the switches S1a to Sna and S1b to Snb on the basis of the acquired temperature information. Specifically, when the acquired temperature information is not included in a predetermined allowable range, the switch control unit SC changes the number of switches that will be turned ON among the switches S1a to Sna and S1b to Snb so that the absolute value of the frequency deviation of the frequency signal fs outputted from the oscillation circuit OC becomes small. Therefore, it is possible to change the load capacities coupled to both ends of the crystal resonator CU and keep the frequency deviation of the frequency signal fs outputted from the oscillation circuit OC within a predetermined allowable range.

Figure 5:
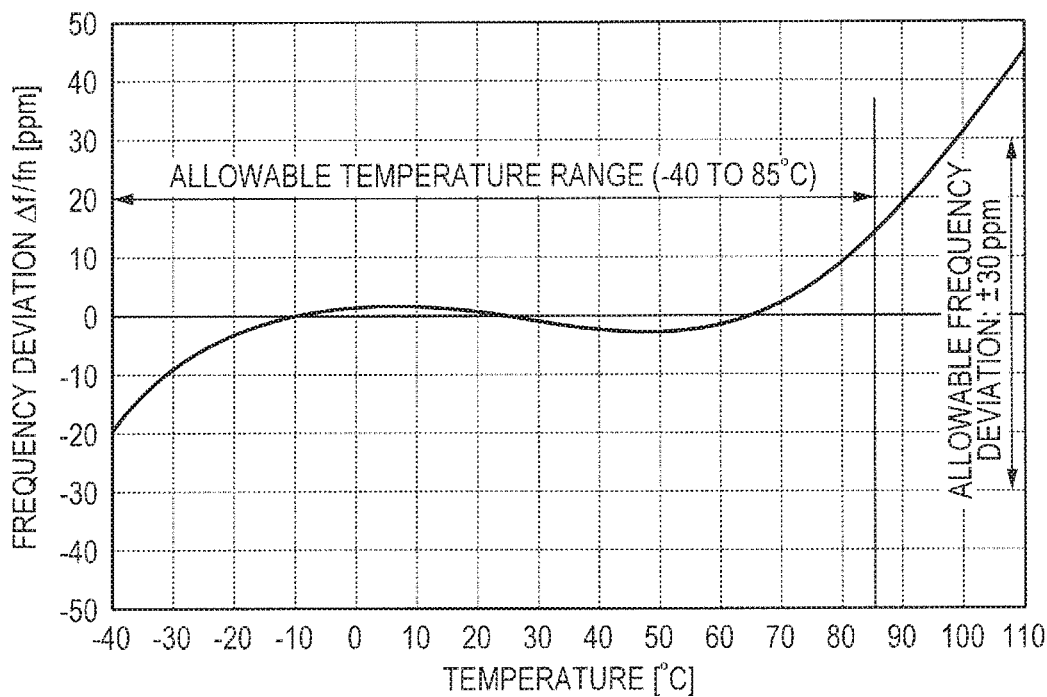
FIG. 5 is a graph showing an example of temperature dependence of frequency deviation Δf/fn of a crystal resonator CU.

Here, FIG. 5 is a graph showing an example of temperature dependence of frequency deviation $\Delta f/fn$ of the crystal resonator CU. The horizontal axis indicates the temperature [° C.] and the vertical axis indicates the frequency deviation $\Delta f/fn$ [ppm]. Here, $\Delta f$ is a difference between an oscillation frequency f and a nominal frequency fn of the crystal resonator CU at each temperature, that is, a frequency shift due to temperature. The frequency shift due to temperature is $\Delta f = f - fn$.

As shown in FIG. 5, the frequency deviation $\Delta f/fn$ varies in a cubic curve with respect to temperature. As shown in FIG. 5, in a compensation temperature range, that is, the allowable temperature range of the crystal resonator CU (−40 to 85° C. in the example of FIG. 5), the frequency deviation $\Delta f/fn$ is within a predetermined allowable range (±30 ppm in the example of FIG. 5).

On the other hand, if a use temperature range is expanded to, for example, −40 to 105° C., the frequency deviation $\Delta f/fn$ of the crystal resonator CU exceeds an upper limit (30 ppm in the example of FIG. 5) of an allowable deviation.

Here, the allowable range of the frequency deviation $\Delta f/fn$ is appropriately set by a communication standard or the like. For example, the allowable range of the frequency deviation in a short-range radio communication standard such as Bluetooth (registered trademark) Low Energy is ±50 ppm. Therefore, it is considered that the allowable range of the frequency deviation is set to, for example, about ±30 ppm considering a margin with respect to the standard. Such an allowable range is one digit larger than that of a communication standard for mobile phone (the allowable range of the frequency deviation is ±3 ppm), so that a frequency deviation as small as that of the temperature compensated crystal oscillator (TCXO) (for example, ±1 ppm or less) is not required.

Figure 6:
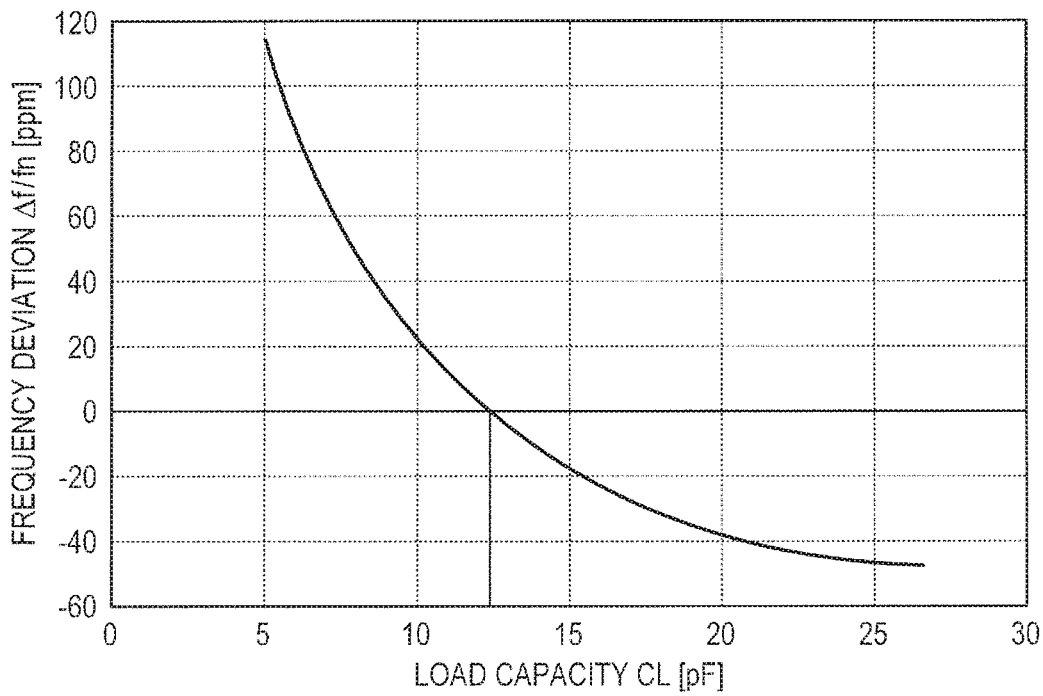
FIG. 6 is a graph showing an example of load capacity dependence of the frequency deviation Δf/fn of the crystal resonator CU.

Here, FIG. 6 is a graph showing an example of load capacity dependence of the frequency deviation $\Delta f/fn$ of the crystal resonator CU. The horizontal axis indicates the load capacity [pF] and the vertical axis indicates the frequency deviation $\Delta f/fn$ [ppm]. In the example of FIG. 6, a load capacity of 12.5 pF is coupled to the crystal resonator CU so that the frequency deviation $\Delta f/fn$ becomes 0 at 25° C. Here, as shown in FIG. 6, when the load capacity coupled to the crystal resonator CU increases, the frequency deviation Δf/fn monotonically decreases.

Therefore, in the semiconductor device 100 according to the present embodiment, when an acquired temperature exceeds, for example, an allowable temperature upper limit (85° C. in the example of FIG. 5), the number of switches that will be turned ON among the switches S1a to Sna and S1b to Snb is increased. That is to say, as shown in FIG. 6, it is possible to decrease the frequency deviation Δf/fn of the frequency signal fs outputted from the oscillation circuit OC by increasing the load capacities coupled to both ends of the crystal resonator CU. As a result, it is possible to keep the frequency deviation Δf/fn of the frequency signal fs within a range of allowable deviation (30 ppm in the example of FIG. 5).

On the other hand, in the semiconductor device 100 according to the present embodiment, it is not necessary to store a huge amount of data in order to cancel a cubic curve shaped temperature dependence as in the temperature compensated crystal oscillator (TCXO). Further, it is not necessary to continuously change the load capacity, so that an analog variable capacitance element such as a varicap is not required. Therefore, in the semiconductor device 100 according to the present embodiment, it is possible to suppress increases of circuit scale and power consumption as compared with in the temperature compensated crystal oscillator.

As described above, in the semiconductor device 100 according to the present embodiment, it is possible to suppress increases of circuit scale and power consumption while keeping the frequency deviation within a predetermined allowable range.

<Control Method of Semiconductor Device>

Figure 7:
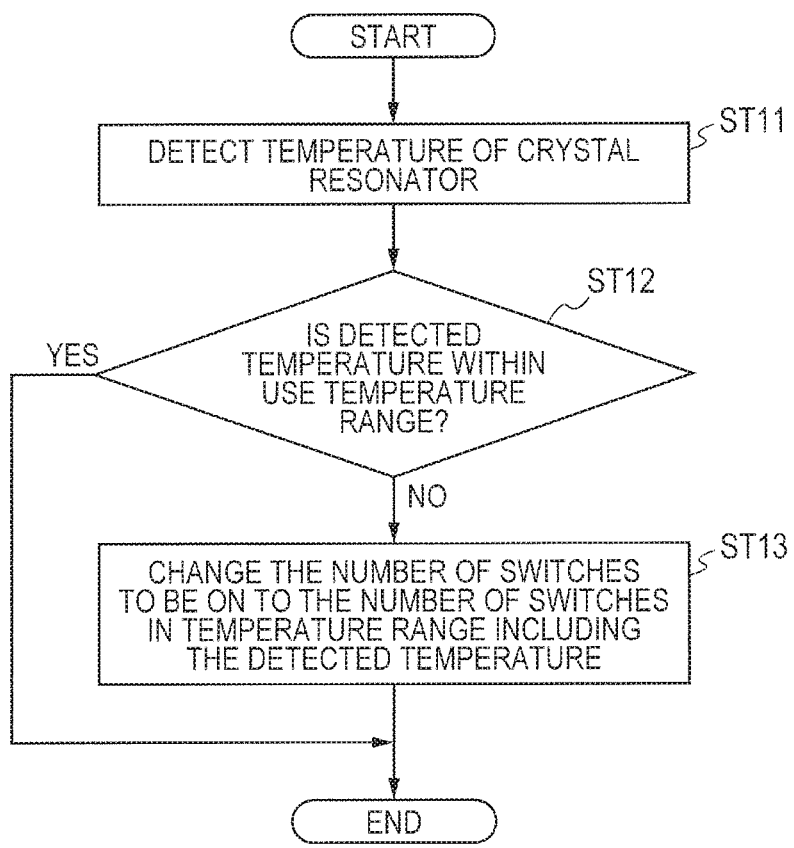
FIG. 7 is a flowchart showing a control method of the semiconductor device according to the first embodiment.

Next, a control method of the semiconductor device according to the first embodiment will be described with reference to FIG. 7. FIG. 7 is a flowchart showing the control method of the semiconductor device according to the first embodiment. In the description of FIG. 7, FIG. 1 is appropriately referred to.

As shown in FIG. 7, first, the temperature sensor TS shown in FIG. 1 detects the temperature of the crystal resonator CU (step ST11).

Next, the switch control unit SC determines whether or not the temperature detected by the temperature sensor TS is within an in-use temperature range in the table stored in the memory unit MEM (see FIG. 3) (step ST12). A temperature range that is used first is the allowable temperature range.

When the detected temperature is within the in-use temperature range in the table shown in FIG. 3 (step ST12 YES), the switch control unit SC does not change the number of switches (the number of pairs of switches) to be ON and ends switch control without change. On the other hand, when the detected temperature is not within the in-use temperature range in the table shown in FIG. 3 (step ST12 NO), the switch control unit SC changes the number of switches (the number of pairs of switches) to be ON to a number corresponding to a temperature range including the detected temperature (step ST13) and then ends the switch control.

In the semiconductor device 100 according to the present embodiment, to reduce power consumption, the power source is turned off and the oscillation circuit OC stops every time packet transmission/reception is completed. Therefore, for example, every time a packet is transmitted/received, the switch control unit SC repeats the control shown in FIG. 7 after the power source is turned on until packet transmission/reception is completed. For example, in the case of Bluetooth Low Energy, packet transmission/reception of 625 μs is repeated at intervals of 7.5 ms. The control shown in FIG. 7 may be repeated every time a plurality of times of packet transmission/reception are performed, instead of every time a packet is transmitted/received. At a timing when the number of switches to be ON is changed, load capacity elements whose potentials are different are coupled, so that the frequency of the frequency signal fs outputted from the oscillation circuit OC may largely vary. Therefore, it is preferable that the timing when the number of switches to be ON is changed is other than during transmission/reception of a packet.

Second Embodiment

<Detailed Configuration of Semiconductor Device 200>

Figure 8:
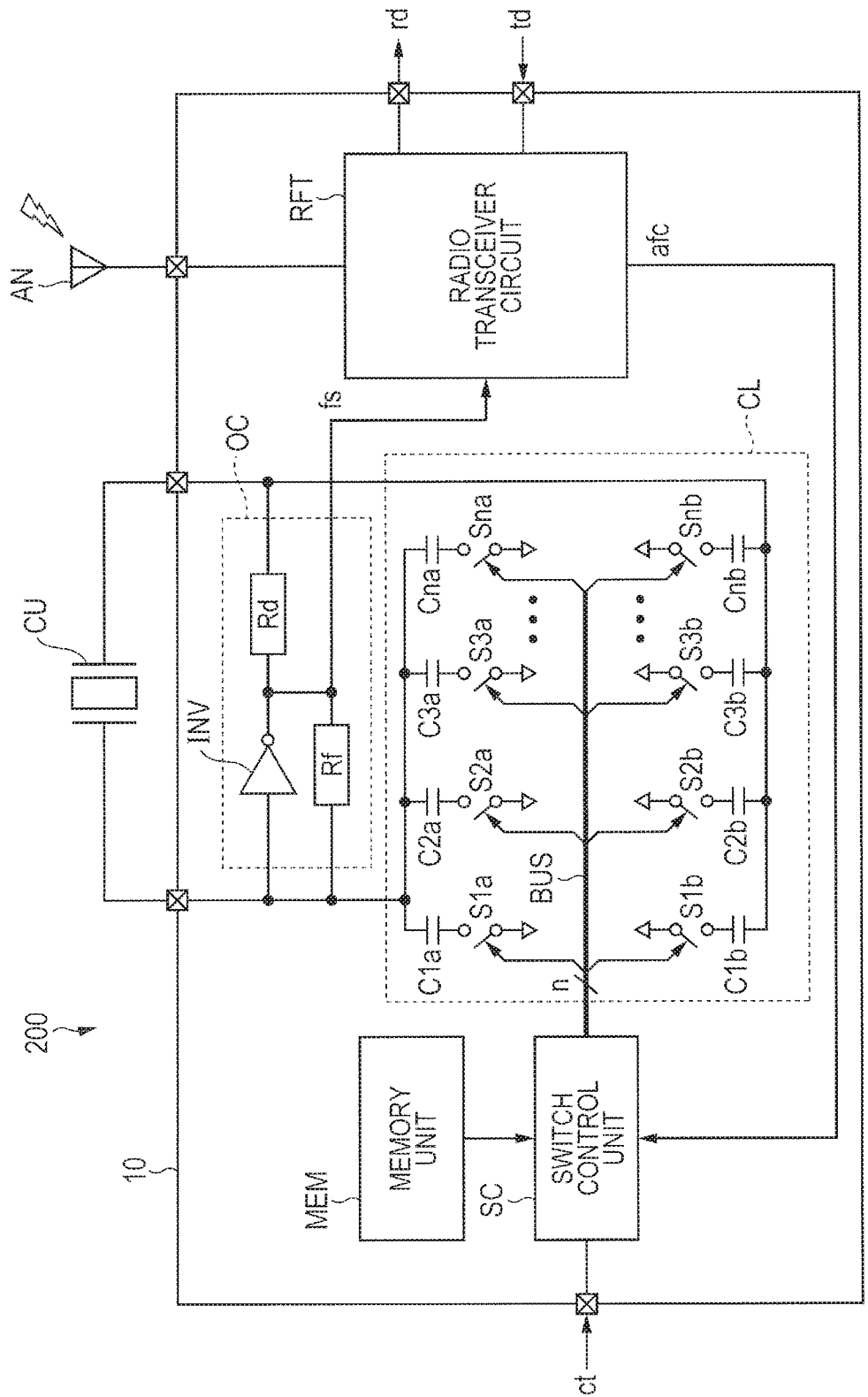
FIG. 8 is a detailed block diagram showing a configuration of a semiconductor device 200 according to a second embodiment.

Next, a semiconductor device according to the second embodiment will be described in detail with reference to FIG. 2. FIG. 8 is a detailed block diagram showing a configuration of the semiconductor device 200 according to the second embodiment.

In the semiconductor device 100 according to the first embodiment shown in FIG. 2, the switch control unit SC controls ON/OFF of the n pairs of switches S1a to Sna and S1b to Snb on the basis of the temperature information acquired from the temperature sensor TS. On the other hand, in the semiconductor device 200 according to the second embodiment shown in FIG. 8, the switch control unit SC controls ON/OFF of the n pairs of switches S1a to Sna and S1b to Snb on the basis of an automatic frequency control (AFC) signal afc acquired from the radio transceiver circuit RFT. Therefore, the semiconductor device 200 according to the second embodiment does not require the temperature sensor TS.

The AFC signal afc is a difference between a frequency (hereinafter referred to as a master frequency) of a reception RF signal received from a master wireless apparatus (not shown in the drawings) and the frequency of the frequency signal fs outputted from the oscillation circuit OC. The master frequency is maintained constant at all times and is equal to the nominal frequency fn of the crystal resonator CU. That is to say, the AFC signal afc corresponds to a frequency shift due to temperature of the frequency signal fs outputted from the oscillation circuit OC.

Figures 9, 10:
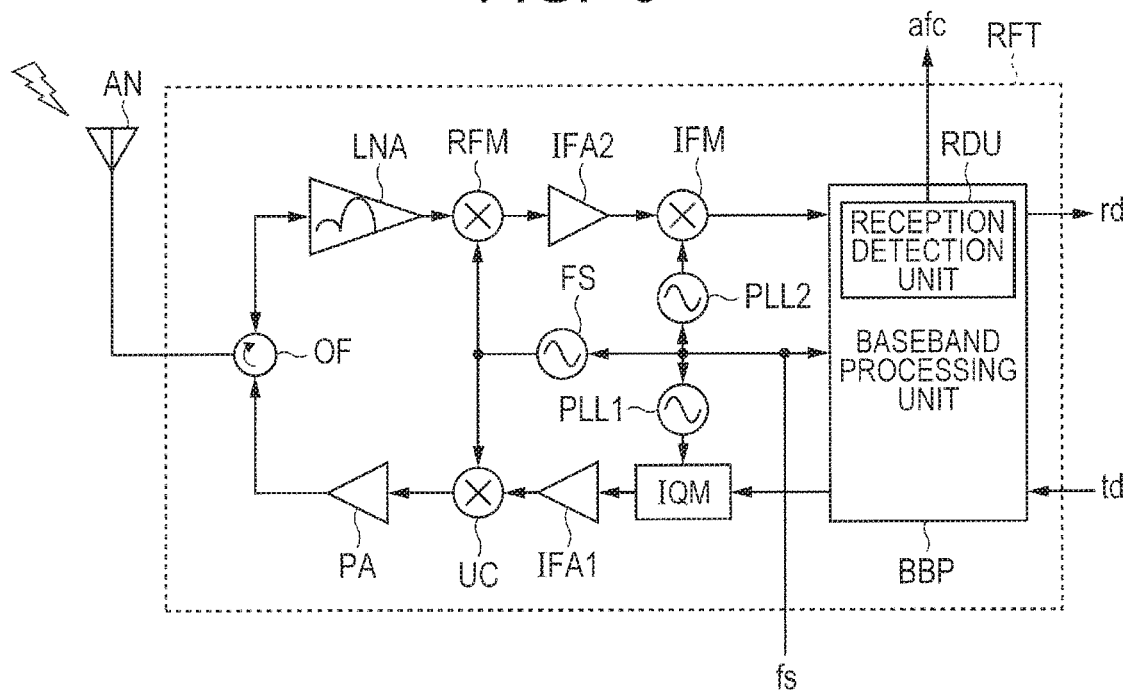
FIG. 9 is a block diagram showing an example of a configuration of a radio transceiver circuit RFT included in the semiconductor device 200 according to the second embodiment.
FIG. 10 is a diagram showing an example of a table stored in a memory unit MEM in the semiconductor device 200 according to the second embodiment.

Here, FIG. 9 is a block diagram showing an example of a configuration of the radio transceiver circuit RFT included in the semiconductor device 200 according to the second embodiment. The radio transceiver circuit RFT shown in FIG. 9 has the same circuit configuration as that of the radio transceiver circuit RFT shown in FIG. 4. As shown in FIG. 9, the baseband processing unit BBP includes a reception detection unit RDU. The reception detection unit RDU generates the AFC signal afc and outputs the AFC signal afc to the switch control unit SC. In FIG. 4, the reception detection unit RDU is omitted.

As shown in FIG. 9, the reception detection unit RDU receives the frequency of the reception IQ signal outputted from the IF mixer IFM and the frequency of the frequency signal fs outputted from the oscillation circuit OC. Here, the frequency of the reception IQ signal is the master frequency. Therefore, the reception detection unit RDU can generate the AFC signal afc corresponding to a difference between the master frequency and the frequency of the frequency signal fs outputted from the oscillation circuit OC.

As shown in FIG. 8, the switch control unit SC acquires the AFC signal afc, that is, the frequency shift of the frequency signal fs, from the radio transceiver circuit RFT.

Then, the switch control unit SC controls ON/OFF of n pairs of the switches S1a to Sna and S1b to Snb through the bus BUS including n signal lines on the basis of the acquired frequency shift of the frequency signal fs. Here, ON/OFF of the switches S1a and Sib, which are a pair, is controlled by the same signal. Similarly, ON/OFF of the switches S1a and S1b to the switches Sna and Snb, which are pairs, is controlled by the same signal, respectively.

When the switch control unit SC acquires the frequency shift of the frequency signal fs, the switch control unit SC refers to the table stored in the memory unit MEM and controls ON/OFF of the switches S1a to Sna and S1b to Snb. Therefore, it is possible to quickly process ON/OFF control of the switches S1a to Sna and S1b to Snb.

When the acquired frequency shift of the frequency signal fs is not included in a predetermined allowable range, the switch control unit SC changes the number of switches that will be turned ON among the switches S1a to Sna and S1b to Snb so that the absolute value of the frequency deviation of the frequency signal fs outputted from the oscillation circuit OC becomes small. Thereby, the number of the load capacity elements C1a to Cna that are coupled between one end of the crystal resonator CU and the ground is changed, and the load capacity coupled to the one end of the crystal resonator CU is changed. Similarly, the number of the load capacity elements C1b to Cnb that are coupled between the other end of the crystal resonator CU and the ground is changed, and the load capacity coupled to the other end of the crystal resonator CU is changed.

Here, FIG. 10 is a diagram showing an example of the table stored in the memory unit MEM in the semiconductor device 200 according to the second embodiment. As shown in FIG. 10, the table shows the amount of frequency lowering when one pair of switches to be ON is added for each type (crystal type) of crystal resonator CU. In the example of FIG. 10, the amount of frequency lowering when one pair of switches to be ON is added is shown for each of different crystal types A, B, and C. The amount of frequency lowering can be acquired from the load capacity dependence of the frequency deviation $\Delta f/fn$ of the crystal resonator CU shown in FIG. 6.

In the example of FIG. 10, specifically, in the case of crystal type A, when one pair of switches to be ON is added, the frequency changes by −8 kHz. In the case of crystal type B, when one pair of switches to be ON is added, the frequency changes by −13 kHz. In the case of crystal type C, when one pair of switches to be ON is added, the frequency changes by −10 kHz. As a matter of course, the values in FIG. 10 of frequency change when one pair of switches to be ON is added are only an example and can be appropriately changed.

Specific examples will be described below.

When the nominal frequency fn is 2.4 GHz and the allowable deviation of the frequency deviation $\Delta f/fn$ of the frequency signal fs is ±30 ppm, the allowable range of the frequency shift of the frequency signal fs is ±72 kHz (=2.4 GHz×(±30 ppm)). Therefore, when the acquired AFC signal afc, that is, the frequency shift of the frequency signal fs, is included in the allowable range (±72 kHz), the switch control unit SC does not change the number of switches to be ON.

On the other hand, when the frequency shift of the acquired frequency signal fs is not included in the allowable range (±72 kHz), the switch control unit SC divides a value of the frequency shift by the amount of frequency lowering when one pair of switches to be ON is added shown in FIG. 10. When the obtained quotient is a positive value, the number of pairs of switches to be ON is increased by a value corresponding to the integral part of the quotient, and when obtained quotient is a negative value, the number of pairs of switches to be ON is decreased by a value corresponding to the integral part of the quotient.

As a specific example, it is assumed that the crystal type B is used where the amount of frequency lowering when one pair of switches to be ON is added shown in FIG. 10 is 13 kHz and the AFC signal afc, that is, a value of the frequency shift of the frequency signal fs, is not included in the allowable range (±72 kHz). When the value of the frequency shift is 80 KHz that exceeds an allowable upper limit value 72 kHz, six pairs of switches to be ON are added because 80 kHz/13 kHz=6.1 . . . . On the other hand, when the value of the frequency shift is −80 KHz that falls below an allowable lower limit value −72 kHz, six pairs of switches to be ON are subtracted because −80 kHz/13 kHz=−6.1 . . . . By such a control, it is possible to keep the frequency deviation of the frequency signal fs outputted from the oscillation circuit OC within a predetermined allowable range.

<Description of Effects>

As described above, the semiconductor device 200 according to the present embodiment includes the switch control unit SC that controls ON/OFF of the switches S1a to Sna and S1b to Snb on the basis of the AFC signal afc indicating the shift of the frequency signal fs due to temperature change. Specifically, when the shift of the acquired frequency signal fs is not included in a predetermined allowable range, the switch control unit SC changes the number of switches that will be turned ON among the switches S1a to Sna and S1b to Snb so that the absolute value of the frequency deviation of the frequency signal fs becomes small. Therefore, it is possible to change the load capacities coupled to both ends of the crystal resonator CU and keep the frequency deviation of the frequency signal fs outputted from the oscillation circuit OC within a predetermined allowable range.

On the other hand, also in the semiconductor device 200 according to the present embodiment, it is not necessary to store a huge amount of data in order to cancel a cubic curve shaped temperature dependence as in the temperature compensated crystal oscillator (TCXO). Further, it is not necessary to continuously change the load capacity, so that an analog variable capacitance element such as a varicap is not required. Therefore, also in the semiconductor device 200 according to the present embodiment, it is possible to suppress increases of circuit scale and power consumption as compared with in the temperature compensated crystal oscillator.

Further, in the semiconductor device 200 according to the present embodiment, the temperature sensor TS is not required, so that it is possible to further suppress increases of circuit scale and power consumption as compared with in the semiconductor device 100 according to the first embodiment.

As described above, also in the semiconductor device 200 according to the present embodiment, it is possible to suppress increases of circuit scale and power consumption while keeping the frequency deviation within a predetermined allowable range.

<Control Method of Semiconductor Device>

Figure 11:
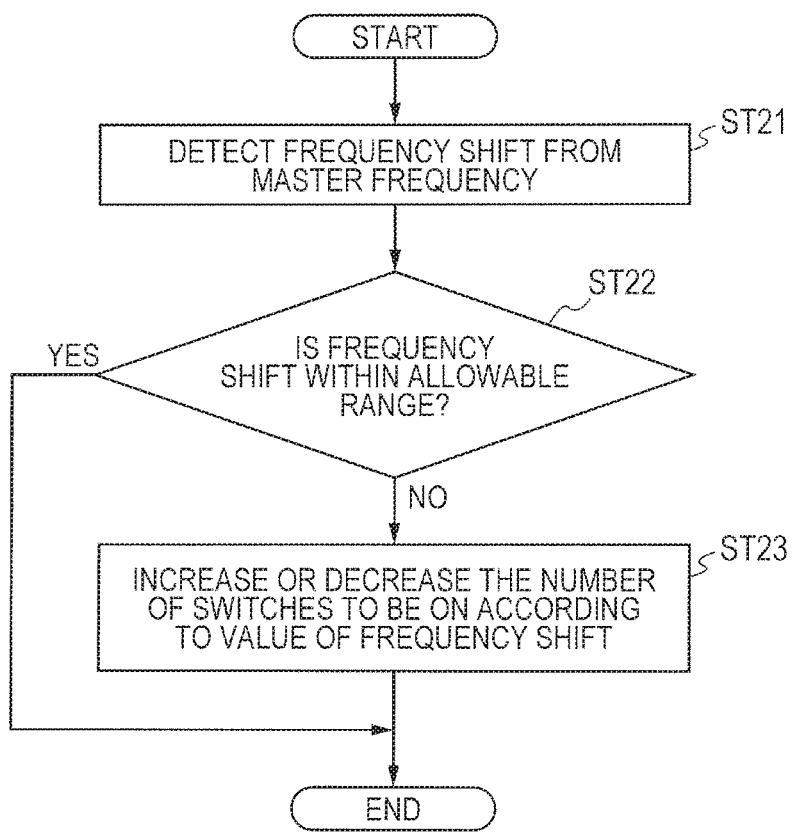
FIG. 11 is a flowchart showing a control method of the semiconductor device according to the second embodiment.

Next, a control method of the semiconductor device according to the second embodiment will be described with reference to FIG. 11. FIG. 11 is a flowchart showing the control method of the semiconductor device according to the second embodiment. In the description of FIG. 11, FIGS. 8 and 9 are appropriately referred to.

As shown in FIG. 11, first, the reception detection unit RDU shown in FIG. 9 detects a frequency shift between the frequency signal fs and the master frequency (step ST21).

Next, the switch control unit SC determines whether or not the frequency shift of the frequency signal fs acquired from the reception detection unit RDU is included in a predetermined allowable range (step ST22).

When the frequency shift of the frequency signal fs is included in the predetermined allowable range (step ST22 YES), the switch control unit SC does not change the number of switches (the number of pairs of switches) to be ON and ends switch control without change. On the other hand, when the frequency shift of the frequency signal fs is not included in the predetermined allowable range (step ST22 NO), the switch control unit SC changes the number of switches (the number of pairs of switches) to be ON according to a value of the frequency shift of the frequency signal fs and then ends the switch control.

Also in the semiconductor device 200 according to the present embodiment, to reduce power consumption, the power source is turned off and the oscillation circuit OC stops every time packet transmission/reception is completed. Therefore, for example, every time a packet is transmitted/received, the switch control unit SC repeats the control shown in FIG. 11 after the power source is turned on until packet transmission/reception is completed. The control shown in FIG. 11 may be repeated every time a plurality of times of packet transmission/reception are performed, instead of every time a packet is transmitted/received. At a timing when the number of switches to be ON is changed, load capacity elements whose potentials are different are coupled, so that the frequency of the frequency signal fs outputted from the oscillation circuit OC may largely vary. Therefore, it is preferable that the timing when the number of switches to be ON is changed is other than during transmission/reception of a packet.

While the invention made by the inventors has been specifically described based on the embodiments, it is needless to say that the present invention is not limited to the embodiments described above and may be variously modified without departing from the scope of the invention.

What is claimed is:

1. A semiconductor device comprising:
   a crystal resonator;
   an oscillation circuit that oscillates the crystal resonator and outputs a frequency signal;
   a variable load capacity circuit including 1) a plurality of load capacity elements coupled in parallel with each other and coupled to one end of the crystal resonator and 2) a plurality of switches that are respectively serially coupled to the load capacity elements;
   a temperature sensor that detects a temperature of the crystal resonator and generates temperature information based on the detected temperature of the crystal resonator; and
   a switch control unit that controls ON/OFF of the switches based on the temperature information,
   wherein, when the temperature information that is used as an index of frequency deviation of the frequency signal due to a change in the temperature of the crystal resonator falls outside a predetermined allowable range, the switch control unit changes a number of switches to be turned ON among the plurality of switches to allow an absolute value of the frequency deviation to be small.

2. The semiconductor device according to claim 1, wherein the information is frequency shift information between a frequency of the frequency signal and a master frequency of a wireless signal received from an external master wireless device.

3. The semiconductor device according to claim 1, wherein the switch control unit changes the number of switches that will be turned ON among the plurality of switches during a period where no packet is transmitted or received.

4. The semiconductor device according to claim 1, wherein capacities of the load capacity elements are equal to each other.

5. The semiconductor device according to claim 1, wherein the variable load capacity circuit further includes a plurality of load capacity elements coupled in parallel to the other end of the crystal resonator and a plurality of switches that are respectively serially coupled to the load capacity elements.

6. The semiconductor device according to claim 5, wherein a number of the load capacity elements coupled to one end of the crystal resonator and the number of the load capacity elements coupled to the other end of the crystal resonator are the same.

7. The semiconductor device according to claim 5, wherein capacities of the load capacity elements coupled to one end and the other end of the crystal resonator are equal to each other.

8. A control method of a semiconductor device including
   a crystal resonator,
   an oscillation circuit that oscillates the crystal resonator and outputs a frequency signal,
   a variable load capacity circuit including 1) a plurality of load capacity elements coupled in parallel with each other and coupled to one end of the crystal resonator and 2) a plurality of switches that are respectively serially coupled to the load capacity elements, and
   a temperature sensor that detects a temperature of the crystal resonator and generates temperature information based on the detected temperature of the crystal resonator, the control method comprising:
   acquiring the temperature information from the temperature sensor, and
   changing, when the temperature information that is used as an index of frequency deviation of the frequency signal due to a change in the temperature of the crystal resonator falls outside a predetermined allowable range, a number of switches to be turned ON among the plurality of switches to allow an absolute value of the frequency deviation to be small.

9. The control method of a semiconductor device according to claim 8, wherein the information is frequency shift information between a frequency of the frequency signal and a master frequency of a wireless signal received from an external master wireless device.

10. The control method of a semiconductor device according to claim 8, wherein the number of switches that will be turned ON among the plurality of switches is changed during a period where no packet is transmitted or received.

11. The control method of a semiconductor device according to claim 8, wherein capacities of the load capacity elements are equal to each other.

12. The control method of a semiconductor device according to claim 8, wherein the variable load capacity circuit further includes a plurality of load capacity elements coupled in parallel to the other end of the crystal resonator and a plurality of switches that are respectively serially coupled to the load capacity elements.

13. The control method of a semiconductor device according to claim 12, wherein a number of the load capacity elements coupled to one end of the crystal resonator and the number of the load capacity elements coupled to the other end of the crystal resonator are the same.

14. The control method of a semiconductor device according to claim 12, wherein capacities of the load capacity elements coupled to one end and the other end of the crystal resonator are equal to each other.

15. A semiconductor device comprising:
- a crystal resonator;
- an oscillation circuit that oscillates the crystal resonator and outputs a frequency signal;
- a radio transceiver circuit that receives the frequency signal from the oscillation circuit and generates a transmission signal using the received frequency signal, the radio transceiver circuit wirelessly transmitting the generated transmission signal via an antenna;
- a variable load capacity circuit including 1) a plurality of load capacity elements coupled in parallel with each other and coupled to one end of the crystal resonator and 2) a plurality of switches that are respectively serially coupled to the load capacity elements;
- a temperature sensor that detects a temperature of the crystal resonator and generates temperature information based on the detected temperature of the crystal resonator; and
- a switch control unit that controls ON/OFF of the switches based on the temperature information, wherein, when the temperature information that is used as an index of frequency deviation of the frequency signal due to a change in the temperature of the crystal resonator falls outside a predetermined allowable range, the switch control unit changes a number of switches to be turned ON among the plurality of switches to allow an absolute value of the frequency deviation to be small.

* * * * *